United States Patent
Sicignano et al.

(10) Patent No.: US 6,596,993 B1
(45) Date of Patent: Jul. 22, 2003

(54) METHOD OF AUTOMATICALLY CORRECTING MAGNIFICATION AND NON-LINEARITY OF SCANNING ELECTRON MICROSCOPE

(75) Inventors: Albert Sicignano, Mt. Kisco, NY (US); Tim Goldburt, Chappaqua, NY (US); Dmitriy Yeremin, Ardsley, NY (US)

(73) Assignee: General Phosphorix LLC, Ardsley, NY (US)

( * ) Notice: Subject to any disclaimer, the term of this patent is extended or adjusted under 35 U.S.C. 154(b) by 259 days.

(21) Appl. No.: 09/696,252

(22) Filed: Oct. 26, 2000

(51) Int. Cl.$^7$ ................................................ G21K 7/00
(52) U.S. Cl. ..................... 250/311; 250/559.27
(58) Field of Search ............... 250/599.27, 599.29, 250/559.3, 559.4, 559.45, 201.2, 310, 311; 315/169.3; 356/411

(56) References Cited

U.S. PATENT DOCUMENTS 6,107,637 A * 8/2000 Watanabe et al. ........ 250/559.3

* cited by examiner

Primary Examiner—John R. Lee
Assistant Examiner—Phillip A Johnston
(74) Attorney, Agent, or Firm—I. Z. Borovsky

(57) ABSTRACT

A method of automatically correcting magnification and/or non linearity of scanning electron microscope has the steps of loading a reference material in the microscope, inputting a pitch of the reference material and a nominal magnification of the microscope, obtaining an image of the reference material, determining a pitch and/or a linearity of the image of the reference material, comparing the pitch of the image with the inputted pitch of the reference material to obtain a ratio indicative of the magnification and/or comparing the magnification in different locations across an image field indicative of the linearity, comparing the thusly determined magnification with the nominal magnification, and if an error of magnification exceeds a predetermined value, adjusting the scanning electron microscope.

7 Claims, 3 Drawing Sheets

METHOD OF AUTOMATICALLY CORRECTING MAGNIFICATION AND NON-LINEARITY OF SCANNING ELECTRON MICROSCOPE

BACKGROUND OF THE INVENTION

The present invention relates to a method of automatically correcting magnification and non-linearity of scanning electron microscope.

When a magnification and/or non-linearity of scanning electron microscope deviates from nominal values, it is necessary to perform the correction of these parameters with a desired precisions.

No known methods are known for performing automatic correction of the magnification and/or non linearity. It is believed that it is exceptionally important to perform the automatic correction of these parameters.

SUMMARY OF THE INVENTION

Accordingly, it is an object of present invention to provide an automatic correction of magnification and/or non-linearity of an electronic microscope to achieve the nominal values of these parameters.

In keeping with these objects and with others which will become apparent hereinafter, one feature of present invention, resides, briefly stated, in a method of a method of automatically correcting magnification and non-linearity of scanning electron microscope, in which the following steps are performed:

A method of automatically correcting magnification and/or non linearity of scanning electron microscope has the steps of loading a reference material in the microscope, inputting a pitch of the reference material and a nominal magnification of the microscope, obtaining an image of the reference material, determining a pitch and/or a linearity of the image of the reference material, comparing the pitch of the image with the inputted pitch of the reference material to obtain a ratio indicative of the magnification and/or comparing the magnification in different locations across an image field indicative of the linearity, comparing the thusly determined magnification with the nominal magnification, and if an error of magnification exceeds a predetermined value, adjusting the scanning electron microscope.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
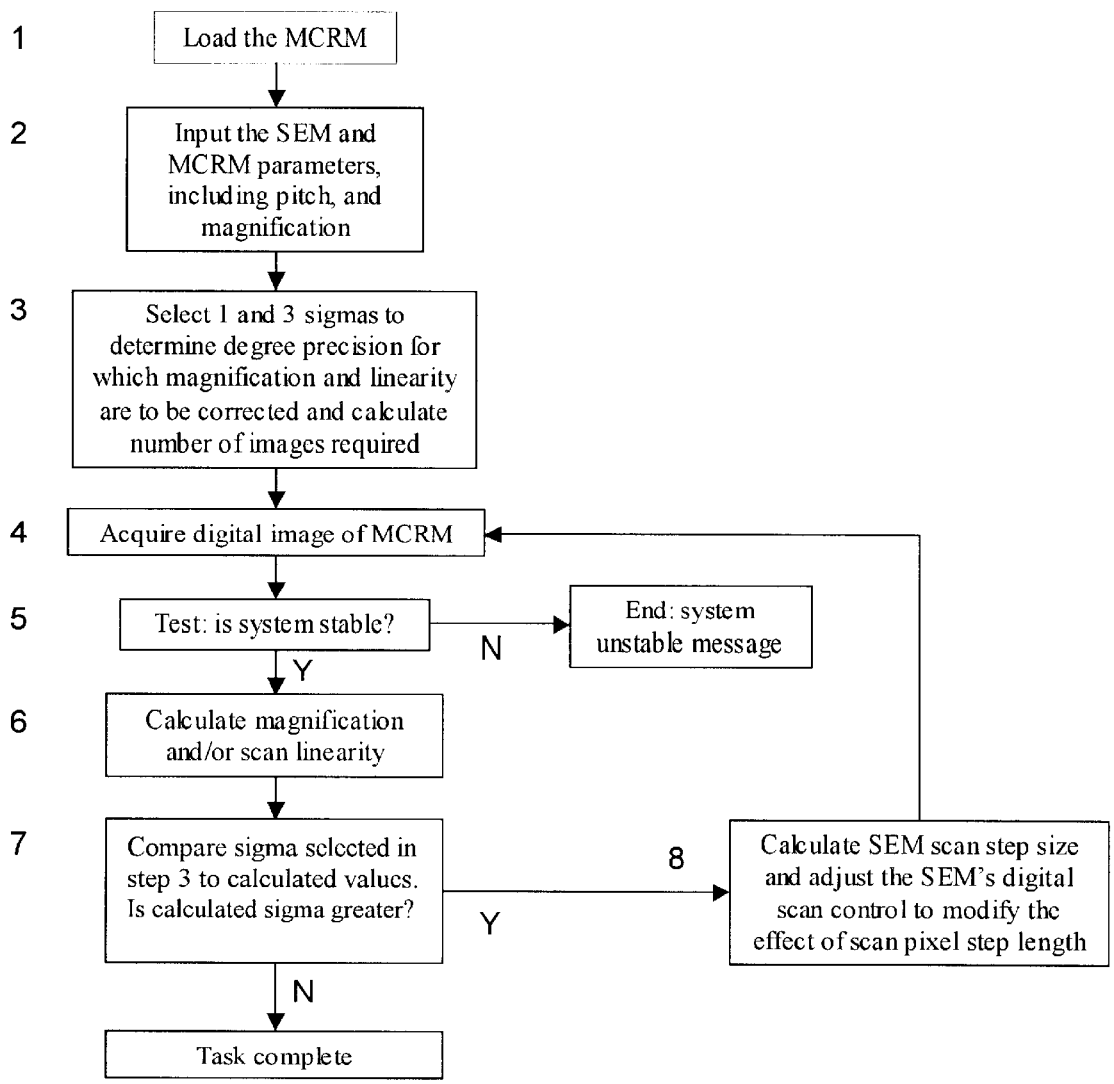
FIG. 1 is a view showing a flow chart of the method in accordance with the present invention.
Figure 2A:
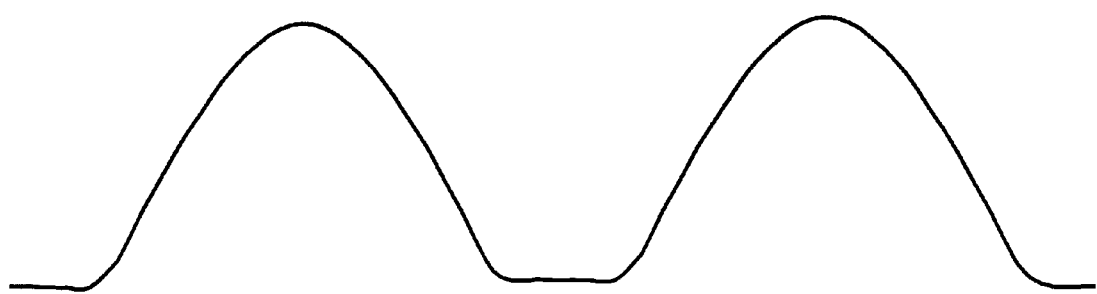
FIGS. 2a–2c are views showing a reference material in accordance with the three embodiments, which are used in the inventive method.
Figure 2B:
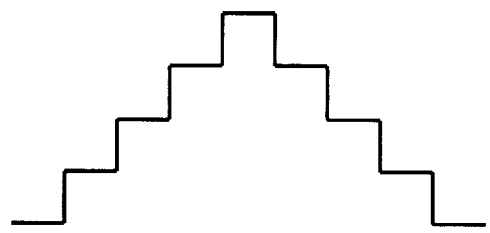
Figure 2C:

In accordance with the present invention, in order to automatically correct magnification and/or non linearity of scanning electron microscope, first a reference material is loaded in the system, in step 1. The reference material can be the material In accordance with several embodiments shown in FIGS. 2a–2c as disclosed in our copending application Ser. No. 09/696,256, and having a plurality of features with inclined sides converging upwardly substantially to a point as shown in FIG. 2a, with stepped sides converging upwardly as shown in FIG. 2b, and formed in correspondence with a Gaussian curve shown in FIG. 2c.

In the next step 2, a pitch of the reference material is introduced, as well as a nominal magnification of the scanning electron microscope. In the step 3, a degree of precision for determination of the magnification and linearity are introduced.

One or more images are selected to be made for the determination of the magnification and/or linearity.

The digital images of the reference material are produced in the scanning electron microscope. The digital image includes the image of the features of the reference material oriented in two orthogonal directions.

In step 5 it is determined whether the system is stable or not. For this purpose the linearity of the magnification is determined in each image by determining the magnifications at different locations in the scanned image in each of the two orthogonal directions. The deviation of the linearity from one image to the other is determined, and the system is considered to be stable if the deviation of the linearities falls within a predetermined value, for example 1% or less. The method proceeds to a further step if the system is stable. If the system is not stable, the system does not proceed to further steps for calibration. The user can be alerted to the determined instability of the system, for example by a flag of the display.

Then if in step 5 the system is determined as stable, the magnification and/or linearity are calculated in step 6 by measuring the pitch of the features in the image in two orthogonal directions, and comparing the thusly measured pitch with the known pitch of the reference material, to obtain a ratio which is indicative of the magnification. The comparison of the magnification in different locations across the image field is indicative of the linearity, in two mutual orthogonal directions. The pitch measurement can be done, for example, using the method described in our patent application Ser. No. 09/346,902.

In step 7 the determined magnification is compared with the nominal magnification introduced in step 2, and an error of the magnification is determined and compared with the selected acceptable value of the error of the magnification selected in step 3. If the value of the error is greater than the value of the error introduced in step 3, the scanning electron microscope must be adjusted.

Figure 3:
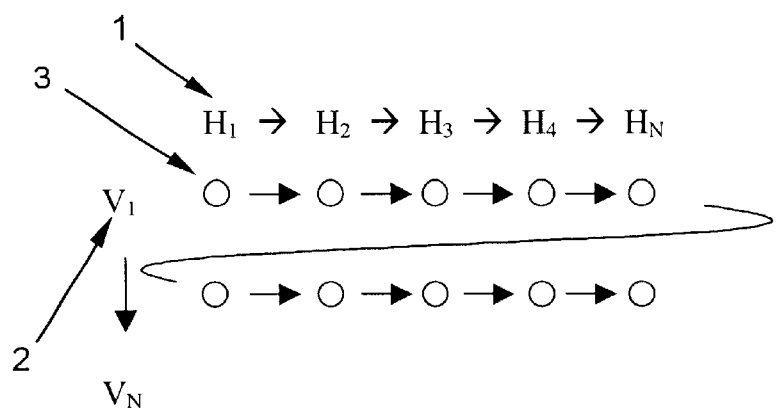
FIG. 3 is a view showing a scanned control array used for the inventive method.
Figure 4:
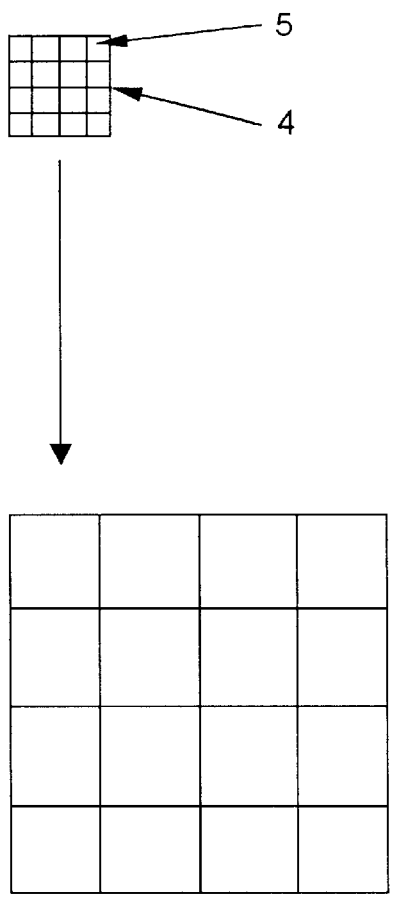
FIG. 4 is a view showing a mapping of a scanning electron microscope scan array into an image array.

The scanning electron microscope has a scanning control mechanism which controls the degree of movement of the electron beam across the sample in two orthogonal directions in a series of steps, and thereby controls the magnification of the microscope. The magnification is defined as a ratio of the size of an image of the object shown in a bottom part of FIG. 4 to the size of the scanned area of the electron beam on the sample as shown in the top part of FIG. 4. FIG. 3 shows the movement of the electron beam between positions, item 3, and the electron beams location defined by the two orthogonal directions, items 1 and 2. In step 8, depending on the error determined in step 7, the electrical parameter (voltage/current) of the signal applied to the scan control circuit is correspondingly adjusted to correct for scan nonlinearity and magnification. The direction and the magnitude of the error is calculated and used to bring it to the values introduced in step 3. Additional measurements are made to check whether the proper adjustment is done to the required values.

It will be understood that each of the elements described above, or two or more together, may also find a useful application in other types of methods differing from the types described above.

While the invention has been illustrated and described as embodied in a method of diagnosing magnification, linearity, and stability of scanning electron microscope, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

What is claimed is:

1. A method of automatically correcting magnification and/or non linearity of scanning electron microscope, comprising the steps of loading a reference material in the microscope; inputting a pitch of the reference material and a nominal magnification of the microscope; obtaining an image of the reference material; determining a pitch and/or a linearity of the image of the reference material, comparing the pitch of the image with the inputted pitch of the reference material to obtain a ratio indicative of the magnification and/or comparing the magnification in different locations across an image field indicative of the linearity; comparing the thusly determined magnification with the nominal magnification; and if an error of magnification exceeds a predetermined value, adjusting the scanning electron microscope.

2. A method as defined in claim 1; and further comprising the step of determining a stability of the microscope so that the method proceeds to a further step only if the system is stable.

3. A method as defined in claim 1, wherein said stability determination includes determining a deviation of the linearity from a predetermined value.

4. A method as defined in claim 2; and further comprising the step of alerting a user to a determined instability of the microscope.

5. A method as defined in claim 1, wherein said step of obtaining an image includes obtaining an actual projected image of the reference material.

6. A method as defined in claim 1, wherein said obtaining of image includes obtaining a digital image of the reference material.

7. A method as defined in claim 1, wherein the reference material and the image has the features oriented in two orthogonal directions.

\* \* \* \* \*